(12) United States Patent
Hayami

(10) Patent No.: US 6,300,886 B1
(45) Date of Patent: Oct. 9, 2001

(54) FOUR-TO-SIX CODE TABLE, MODULATION USING SAME BUT NO MERGING BIT, THEIR APPLICATION TO OPTICAL DISC RECORDING OR PLAYING SYSTEMS

(75) Inventor: Atsushi Hayami, Yokohama (JP)

(73) Assignee: Victor Company of Japan, Ltd., Yokohama (JP)

( * ) Notice: Subject to any disclaimer, the term of this patent is extended or adjusted under 35 U.S.C. 154(b) by 0 days.

(21) Appl. No.: 09/551,835

(22) Filed: Apr. 18, 2000

(30) Foreign Application Priority Data

May 25, 1999 (JP) .................................................. 11-144575

(51) Int. Cl.[7] ..................................................... H03M 7/00

(52) U.S. Cl. ................................................. 341/59; 341/69

(58) Field of Search ................................. 341/58, 59, 68, 341/69

(56) References Cited

U.S. PATENT DOCUMENTS

| | | | |
|---|---|---|---|
| 4,520,346 | * | 5/1985 | Shimaka .................. 341/59 |
| 4,547,890 | * | 10/1985 | Gindi ....................... 341/59 |
| 4,684,921 | * | 8/1987 | Fok et al. ................. 341/59 |
| 5,327,124 | * | 7/1994 | Funamoto ................ 341/58 |
| 5,355,133 | * | 10/1994 | Shimpuku et al. ....... 341/58 |

FOREIGN PATENT DOCUMENTS

| | | |
|---|---|---|
| 6-195887 | 7/1994 | (JP) . |
| 10-340543 | 12/1998 | (JP) . |

* cited by examiner

Primary Examiner—Howard L. Williams
(74) Attorney, Agent, or Firm—Lowe Hauptman Gilman & Berner, LLP

(57) ABSTRACT

A 4-to-6 code table, and a 4-to-6 modulation method and system that uses the table and provides a 6-bit code stream satisfying a (1, 7) RLL constraints and the DSV constraint and including no merging bit are provided. The table comprises a plurality of tables with respective ID's. Each 6-bit code in the table is accompanied with a field containing a table ID for the modulation of the next code. Codes can be used repeatedly in each table such that combinations of appearances of each of the overlapping codes and respective fields are unique in the table. if one of specific patterns of three consecutive input words has been input, then an alternative output code in an alternative code table different from an original code table specified by a next table code associated with the previous input word may be used as an output code for the current input word. The alternative output code and the original output code that is associated with the current input word in the table specified by the next table code associated with the previous input word are different or opposite in the odd/even property. In modulation, a 6-bit code for the current 4-bit code is retrieved from a table identified by the value of the above-mentioned field that accompanies the 6-bit code used for the previous 4-bit code. If two tables are usable, one yielding a smaller DSV absolute value is used.

8 Claims, 9 Drawing Sheets

FIG. 3

| DECIMAL | BINARY |
|---|---|
| 0 | 000000 |
| 1 | 000001 |
| 2 | 000010 |
| 4 | 000100 |
| 5 | 000101 |
| 8 | 001000 |
| 9 | 001001 |
| 10 | 001010 |
| 16 | 010000 |
| 17 | 010001 |
| 18 | 010010 |
| 20 | 010100 |
| 21 | 010101 |
| 32 | 100000 |
| 33 | 100001 |
| 34 | 100010 |
| 36 | 100100 |
| 37 | 100101 |
| 40 | 101000 |
| 41 | 101001 |
| 42 | 101010 |

FIG. 4

| INPUT DATA (b) | TABLE 0 | | | TABLE 1 | | | TABLE 2 | | | TABLE 3 | | |
|---|---|---|---|---|---|---|---|---|---|---|---|---|
| | DECIMAL FOR C | OUTPUT CODE (C) | NT | DECIMAL FOR C | OUTPUT CODE (C) | NT | DECIMAL FOR C | OUTPUT CODE (C) | NT | DECIMAL FOR C | OUTPUT CODE (C) | NT |
| 0 | 21 | 010101 | 0 | 9 | 001001 | 0 | 33 | 100001 | 0 | 21 | 010101 | 0 |
| 1 | 21 | 010101 | 1 | 9 | 001001 | 1 | 33 | 100001 | 1 | 21 | 010101 | 1 |
| 2 | 17 | 010001 | 0 | 5 | 000101 | 0 | 17 | 010001 | 0 | 37 | 100101 | 0 |
| 3 | 17 | 010001 | 1 | 5 | 000101 | 1 | 17 | 010001 | 1 | 37 | 100101 | 1 |
| 4 | 18 | 010010 | 2 | 2 | 000010 | 1 | 18 | 010010 | 2 | 34 | 100010 | 2 |
| 5 | 18 | 010010 | 3 | 2 | 000010 | 2 | 18 | 010010 | 3 | 34 | 100010 | 3 |
| 6 | 18 | 010010 | 3 | 2 | 000010 | 3 | 18 | 010010 | 3 | 34 | 100010 | 1 |
| 7 | 1 | 000001 | 0 | 4 | 000100 | 1 | 36 | 100100 | 1 | 41 | 101001 | 2 |
| 8 | 1 | 000001 | 1 | 4 | 000100 | 1 | 36 | 100100 | 2 | 41 | 101001 | 3 |
| 9 | 20 | 010100 | 2 | 4 | 000100 | 2 | 36 | 100100 | 3 | 20 | 010100 | 1 |
| 10 | 20 | 010100 | 3 | 10 | 001010 | 3 | 42 | 101010 | 1 | 20 | 010100 | 2 |
| 11 | 20 | 010100 | 2 | 10 | 001010 | 2 | 42 | 101010 | 2 | 20 | 010100 | 3 |
| 12 | 0 | 000000 | 3 | 10 | 001010 | 3 | 42 | 101010 | 3 | 32 | 100000 | 2 |
| 13 | 0 | 000000 | 2 | 8 | 001000 | 2 | 40 | 101000 | 2 | 32 | 100000 | 3 |
| 14 | 16 | 010000 | 3 | 8 | 001000 | 3 | 40 | 101000 | 3 | 16 | 010000 | 2 |
| 15 | 16 | 010000 | | 8 | 001000 | | 40 | 101000 | | 16 | 010000 | 3 |

| Pi | NT$_{t-2}$ | D$_{t-1}$ | D$_t$ | ORIGINAL TABLE NT$_{t-1}$ FOR D$_t$ | ALTERNATIVE TABLE AT$_i$ FOR D$_t$ |
|----|-----------|-----------|-------|--------------------------------------|-------------------------------------|
| P1 | 0 or 3 | 15 | 0~3 | 3 | 1 |
| P2 | 0 or 3 | 14 | 7~15 | 2 | 1 |
| P3 | 3 | 13 | 0 or 1 | 3 | 1 |
| P4 | 3 | 12 | 10~15 | 2 | 1 |

6-TO-4 DEMODULATOR

FIG. 9

| DECIMAL FOR C | INPUT CODE (C) | N | DECODED DATA D FOR UT | | | |
|---|---|---|---|---|---|---|
| | | | 0 | 1 | 2 | 3 |
| 0 | 000000 | 2 | — | — | 12 | 13 |
| 1 | 000001 | 0 | 7 | 8 | — | — |
| 2 | 000010 | 1 | — | 4 | 5 | 6 |
| 4 | 000100 | 1 | — | 7 | 8 | 9 |
| 5 | 000101 | 0 | 2 | 3 | — | — |
| 8 | 001000 | 1 | — | 13 | 14 | 15 |
| 9 | 001001 | 0 | 0 | 1 | — | — |
| 10 | 001010 | 1 | — | 10 | 11 | 12 |
| 16 | 010000 | 2 | — | — | 14 | 15 |
| 17 | 010001 | 0 | 2 | 3 | — | — |
| 18 | 010010 | 1 | — | 4 | 5 | 6 |
| 20 | 010100 | 1 | — | 9 | 10 | 11 |
| 21 | 010101 | 0 | 0 | 1 | — | — |
| 32 | 100000 | 2 | — | — | 12 | 13 |
| 33 | 100001 | 0 | 0 | 1 | — | — |
| 34 | 100010 | 1 | — | 4 | 5 | 6 |
| 37 | 100101 | 0 | 2 | 3 | — | — |
| 40 | 101000 | 1 | — | 13 | 14 | 15 |
| 41 | 101001 | 0 | 7 | 8 | — | — |
| 42 | 101010 | 1 | — | 10 | 11 | 12 |

FOUR-TO-SIX CODE TABLE, MODULATION USING SAME BUT NO MERGING BIT, THEIR APPLICATION TO OPTICAL DISC RECORDING OR PLAYING SYSTEMS

BACKGROUND OF THE INVENTION

1. Field of the Invention

The invention generally relates to optical disc recording or playing systems and, more particularly, to a method of and a system for modulating a 4-bit data sequence into a 6-bit code stream based on (1, 7) run-length-limited (RLL) constraints for digital data recording on an optical disc and to a demodulation method and system adapted for the modulation method and system.

2. Description of the Prior Art

In recording on the optical disc or the magnetic disc, a channel coding or modulation scheme known as (1, 7) run-length-limited (RLL) constraints is widely used in view of optical transmission characteristics in recording and reading and physical restrictions involved in pit formation. In the channel coding, for the sake of servo control, the digital sum value (DSV) is controlled so as to satisfy a constraint on low-frequency components as is well known in the art. However, conventional (1, 7) RLL scheme can not afford a satisfactory control of the DSV to some bit patterns to fail in suppression of DC components, resulting in, for example, information signal components mixing in the servo signal band. This presumably causes a problem of adversely affecting the servo performance.

From this point of view, Japanese unexamined patent publication No. 06195887 (1994) discloses "Recording Sign Modulating Device," in which a suggestion is provided to reduce a DC component by avoiding repetition of a specific bit pattern.

Japanese unexamined patent publication No. 10340543 (1998) discloses "Encoding Device, Decoding Device, Encoding Method and Decoding Method Therefore," in which a suggestion is provided to reduce a DC component by inserting a DSV control code by a number of bits having a redundancy as less as possible.

Though the publication No. 06195887 can reduce repetition of a specific bit pattern through bit inversion and/or making patterns random but can hardly suppress a DC component to a satisfactory extent. The publication No. 10340543 seems to provide a preferable DC suppression result but at the same time lowers the storage capacity due to insertion of DSV control codes.

It is therefore an object of the invention to provide a four-to-six modulation code system (or table), and a four-to-six modulation method and system that uses the modulation code table to provides a 6-bit code stream satisfying the (1, 7) RLL and DSV constraints without the need of merging bit or DSV control bit.

SUMMARY OF THE INVENTION

According to an aspect of the invention, there is provided a code table system for use in converting each input code of a 4-bit input code sequence into a 6-bit output code whose NRZI-converted version satisfies (1, 7) run-length-limited (RLL) constraints in a 4-to-6 modulator which simply concatenates the converted 6-bit output codes into a 6-bit output code sequence that still satisfies the run-length limited constraints. The code table system comprises a column for storing $2^4$ possible 4-bit input codes in order of magnitude; and a plurality of columns (hereinafter referred to as "tables"). Each table comprises a table ID for identifying the table and $2^4$ combinations of 6-bit output codes and respective next table fields which combinations are associated in the row directions with respective input codes. Each of the next table fields contains a table ID of a table to be used in a modulation of a next source of the input code sequence so as to cause the input code sequence to satisfy the RLL constraints. Output codes are permitted to appear repeatedly in the 6-bit output codes in each table such that combinations of appearances of each of the repeated output codes and respective next table fields are unique in the table. If one of predetermined patterns of three consecutive input codes is to be coded and if a third input code of the one predetermined pattern is in a predetermined input code range, then an output code associated with the third input code in an original table specified by a next table field associated with a second input code of the one predetermined pattern can be replaced with a corresponding output code in an alternative table assigned to the one predetermined pattern. The odd/even property of output codes of the original table which correspond to the predetermined input code range is different from that of output codes of the alternative table which correspond to the predetermined input code range.

According to another aspect of the invention, a method of and a system for modulating a 4-bit input code sequence into a 6-bit output code sequence which includes no merging bit and whose NRZI converted version satisfies (1, 7) run-length-limited constraints is provided. The method and system use the above-described code system. A first output code associated with an input code of the input code sequence is retrieved from a table identified by a next table field attached to the last modulated output code. A test is made to see if the input code and the two input codes following the input code in the input code sequence coincide with any of the predetermined pattern. In response to a pass in the test, a second output code associated with the input code of the input code sequence is retrieved from the alternative table. A first digital sum value (DSV) and a second DSV are calculated by using the first output code and the second output code, respectively. If the absolute value of the second DSV is smaller than that of the first DSV, then the second output code is included in the 6-bit output code sequence. If the test is unsuccessful or if the absolute of the second DSV is not smaller than that of the first DSV, the first output code is included in the 6-bit output code sequence.

According to further aspect of the invention, a method of and system for demodulating a 6-bit code sequence into a 4-bit code sequence in a 6-to-4 demodulator is provided. The demodulator is provided with a decoding table for associating each of possible 6-bit current codes with an indicator and corresponding 4-bit codes further associated with respective table ID's for use in a demodulation of a next 6-bit code following a current 6-bit code. The indicator indicates a table list listing ID's of tables that might be used for coding of the next 6-bit code. The demodulator further comprises means for associating a 6-bit code with at least one coding table ID from which the 6-bit code can be derived. The indicator and the corresponding 4-bit codes are found from the decoding table by using the current 6-bit code. At least one coding table ID for the next 6-bit code is obtained from the means by using the next 6-bit code. As a next table ID for the next 6-bit code, a table ID common to the at least one coding table ID and table ID's listed in the table list indicated by the indicator is found. A 4-bit code associated with the current 6-bit code and the common table ID is obtained and output.

According to an aspect of the invention, an optical disc storing an NRZI converted version of a 6-bit output code sequence is provided. The output code sequence is obtained through a method of modulating a 4-bit input code sequence into the 6-bit output code sequence which includes no merging bit and whose NRZI converted version satisfies (1, 7) run-length-limited constraints in a 4-to-6 modulator. The modulator is provided with the above-described code table. The method comprises the steps of retrieving a first output code associated with an input code of the input code sequence from a table identified by a next table field attached to the last modulated output code; making a test to see if the input code and the two input code following the input code in the input code sequence coincide with any of the predetermined pattern; in response to a pass in the test, retrieving a second output code associated with the input code of the input code sequence from the alternative table; calculating a first digital sum value (DSV) and a second DSV by using the first output code and the second output code, respectively; if the absolute value of the second DSV is smaller than that of the first DSV, including the second output code in the 6-bit output code sequence; and if the test is unsuccessful or if the absolute of the second DSV is not smaller than that of the first DSV, including the first output code in the 6-bit output code sequence.

BRIEF DESCRIPTION OF THE DRAWING

The features and advantages of the present invention will be apparent from the following description of an exemplary embodiment of the invention and the accompanying drawings, in which:

FIG. 3 is a diagram showing a table of 6-bit binary numbers and corresponding decimal numbers that satisfy the (1, 7) RLL constraints;

FIG. 4 shows a code table according to an illustrative embodiment of the invention;

FIG. 5 is a diagram showing four types of DSV-controllable input word patterns available with the 4-to-6 code system or tables of FIG. 4;

FIG. 9 is a diagram showing a code table for use in the 6-to-4 demodulator 33 of FIG. 8.

Throughout the drawing, the same elements when shown in more than one figure are designated by the same reference numerals.

DETAILED DESCRIPTION OF THE PREFERRED EMBODIMENTS

Figure 1:
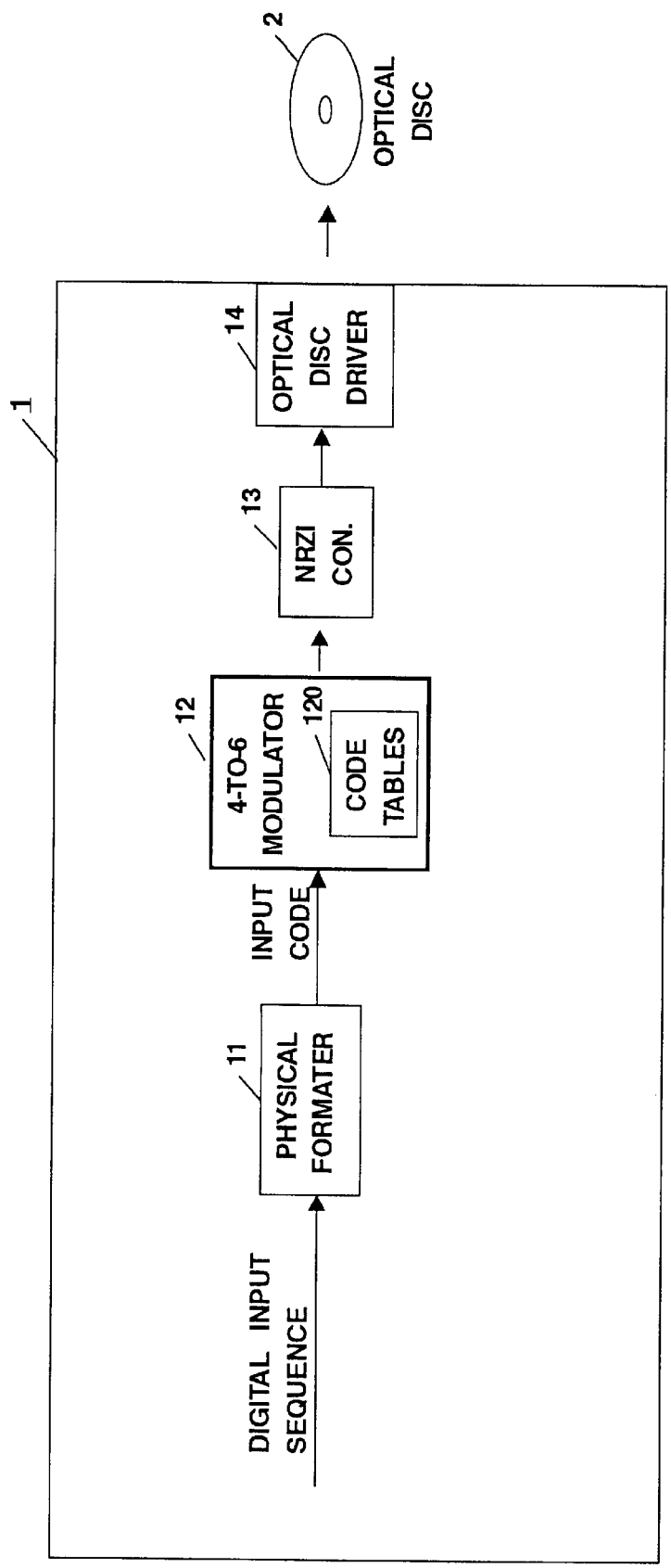
FIG. 1 is a schematic block diagram showing an exemplary device 1 that includes an optical disc recording system (11 through 14) provided with an 4-to-6 modulator 12 according to the principles of the invention.

FIG. 1 is a schematic block diagram showing an exemplary device 1 that includes an optical disc recording system (11 through 14) provided with an 4-to-6 modulator 12 according to the principles of the invention. The device 1 of FIG. 1 may be any device that can record multimedia information on an optical disc 2 by using the inventive 4-to-6 modulator 12. The device 1 includes a physical formatter 11, the 4-to-6 modulator 12, an NRZI converter 13 and an optical disc driver 14. The modulator 12 includes a 4-to-6 code system 120 comprising four code tables according to the principles of the invention. The code system or tables 120 will be detailed later.

In optical disc recording operation, information to be recorded is obtained as a digital input sequence within the device or from the outside through an appropriate interface (not shown). The information may be video and/or audio information. The digital input sequence is supplied to the physical formatter 11. The physical formatter 11 formats the input sequence into a form suited for recording on the optical disc 2 by adding ECC (error correcting codes) and sync signals to the input sequence. The output from the formatter 11 is supplied as 4-bit input codes to the 4-to-6 modulator 12. The modulator 12 modulates the 4-bit input codes into 6-bit output codes in a manner as described in great detail later. The 6-bit output codes are NRZI converted into an NRZI signal. The optical disc driver 14 records the NRZI signal on the optical disc 2.

Figure 2:
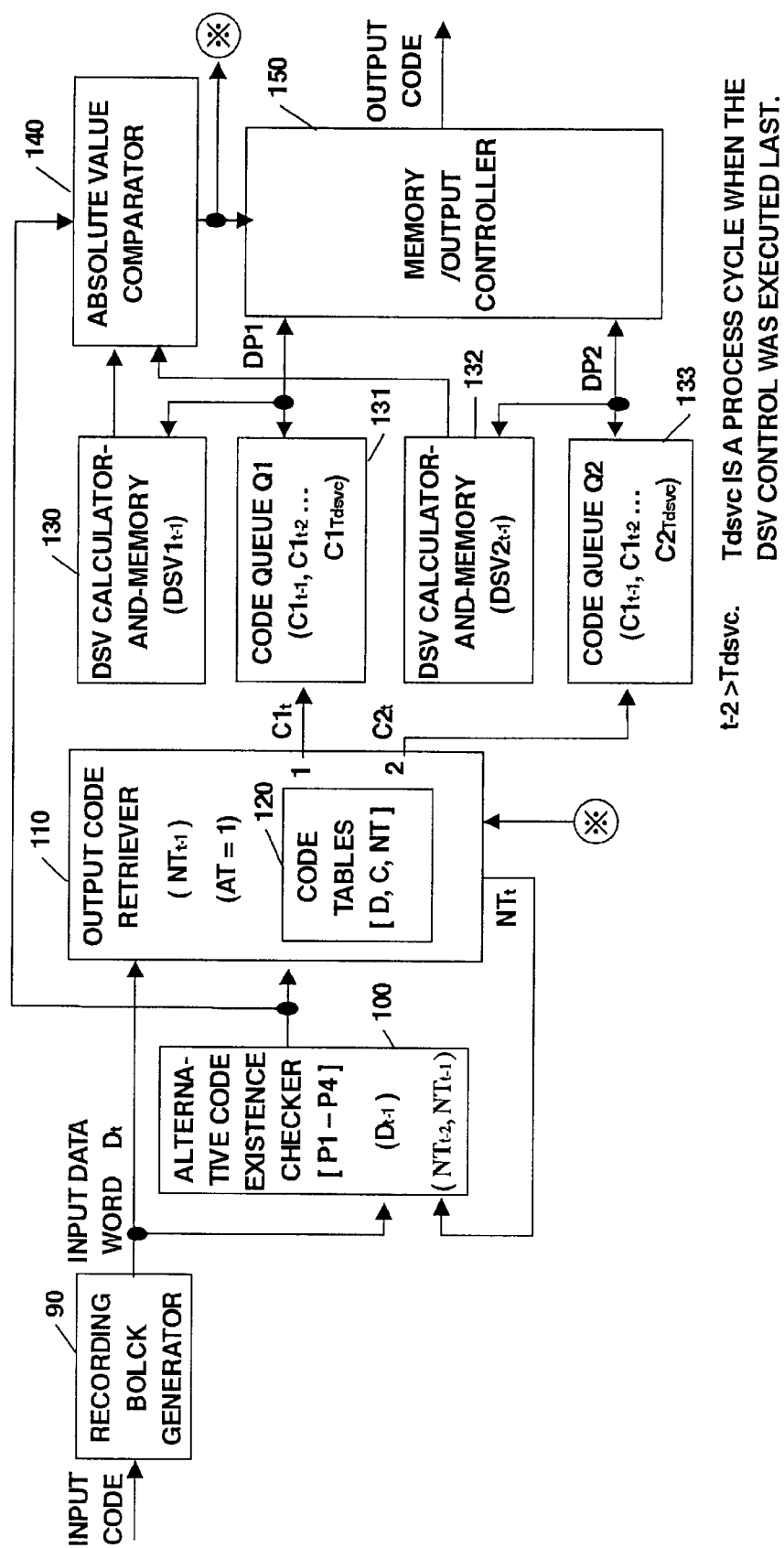
FIG. 2 is a schematic block diagram showing an arrangement of the 4-to-6 modulator 12 of FIG. 1.

FIG. 2 is a schematic block diagram showing an arrangement of the 4-to-6 modulator 12 of FIG. 1. The modulator 12 is provided with a recording block generator 90 at the first stage thereof. The recording block generator 90 converts an input word sequence from the physical formatter 11 into a series of 4-bit code words so as to enable the following portion of the 4-to-6 modulator 12 to each of the code words. The 4-to-6 modulator 12 further comprises an alternative code existence checker 100; an output code retriever 110 for retrieving an output code according to the output from the alternative code existence checker 100; a first pair of a DSV calculator-and-memory (DSV1) 130 and output code queue memory (Q1) 131 having its input connected to a first output terminal of the code retriever 110; a second pair of a DSV calculator-and-memory (DSV2) 132 and output code queue memory (Q2) 133 having its input connected to a second output terminal of the code retriever 110; an absolute value comparator 140 for comparing the values DSV1 and DSV2 of the two DSV calculator-and-memories in response to the alternative code existence checker 100 output; and a memory/output controller 150 for outputting the contents (or digital output code sequence) of a relevant queue memory Q1or Q2 according to the absolute value comparator 140 output.

The alternative code existence checker 100 has read only memory for storing DSV-controllable input pattern data (detailed later), a first buffer memory for temporarily storing next table codes $NT_{t-2}$ and $NT_{t-1}$ associated with the input word of two words before and the previous input word, and a second buffer memory for storing the previous input word $D_{t-1}$ as detailed later. The output code retriever 110 has a memory for temporary storing just used next table code as the next table code $NT_{t-1}$ used for the previous input word $D_{t-1}$.

Since the modulator 12 requires the code system 120 for operation, we discuss the code system or tables 120 prior to the description of the modulation operation.

Four-to-Six Code Table

FIG. 3 is a diagram showing a table of 6-bit binary numbers and corresponding decimal numbers that satisfy the (1, 7) RLL constraints. The 6-bit binary numbers of FIG. 3 can be used to constitute a 4-to-6 code system in accordance with the principles of the invention.

FIG. 4 is a diagram showing an exemplary arrangement of a 4-to-6 code system according to an illustrative embodiment of the invention. The code system comprises an input data word column and four 4-to-6 code tables 0 through 3. The left-most column, i.e., the input data word column lists, in the ascending order, the 16 decimal numbers 0 through 15 corresponding to the possible input 4-bit data words (D). Each of the code tables 0 through 3 comprises an output code field or column that lists 16 6-bit output code (C) which correspond to the 16 decimal numbers (or the possible 4-bit data words); a next table (NT) field that contains next table (NT) codes each of which specifies the table number of the table from which an output code (C) should be selected for the next input data word; and a decimal number column that lists decimal numbers that correspond the output codes (C). Though the decimal number columns have been added in FIG. 4 for facilitating understanding of the output code values, they are of course unnecessary for an actual code tables.

According to the principles of the invention, each next table code (NT) is so arranged that the overall code sequence when an output code (C) associated with the NT code is concatenated to the preceding code sequence still satisfies the (1, 7) RLL constraints. Assume that a data word sequence "4, 5, 6, 7, and 8" (actually in binary code though written in the decimal system for the sake of understanding) is supplied from the recording block generator 90. It is also assumed that the output code retriever 110 uses a predetermined initial code table, e.g., the table 0 in an initial state. Alternatively, the retriever 110 may be so arranged that if the retriever 110 detects a specific sync code in the input code sequence, then the retriever 110 responsively uses the predetermined initial code table. Then, in responsive to a reception of the first 4-bit code "4", the retriever 110 searches the initial table, i.e., table 0 in this example for the code to output an output code "18" (010010) and obtain an next table (NT) code "1" for the search for the next input data word. Then, in response to a reception of the next code "5", the retriever 110 searches table 1 according to the obtained NT code "1" for the code "5" to output an output code "2" (000010) and obtain an NT code "2". In response to a reception of the next code "6", the retriever 110 searches table 2 according to the obtained NT code "2" for the code "6" to output an output code "18" (010010) and obtain an NT code "3". In the same manner, for the next code "7", the retriever 110 searches table 3 to output a code "41" (101001) and obtain an NT code "0". Finally, for the next code "8", the retriever 110 searches table 0 to output a code "1" (000001) and obtain an NT code "1". In this way, the input code sequence "4, 5, 6, 7, and 8" (decimal) causes the retriever 110 to supply output codes "010010, 000010, 010010, 101001, 000001". Concatenating these codes one after another yields an output code sequence "010010000010010010 101001000001".
that satisfies the (1, 7) RLL constraints.

Hereinafter, an input data word at a certain time is expressed by a notation "$D_t$".

According to the principles of the invention, the 4-to-6 code tables are so arranged that if one of specific patterns of three consecutive input words $D_{t-2}$, $D_{t-1}$ and $D_t$ ($D_{t-2}$ is input earliest) has been input, then an alternative output code (hereinafter, denoted by $C2_t$) in an alternative code table different from an original code table specified by an $NT_{t-1}$ code associated with the previous input word $D_{t-1}$ may be used as an output code for the current input word $D_t$ and that the alternative output code $C2_t$ and the original or regular output code ($C1_t$) that is associated with the current input word $D_t$ in the table specified by the $NT_{t-1}$ code associated with the previous input word $D_{t-1}$ are different or opposite in, what we call, the odd/even property. That is, if the number of "1" symbols in the original output code ($C1_t$) is even, then the number of "1" symbols of the alternative output code $C2_t$ is odd, and vice versa. Since it is possible to select one of two output codes $C1_t$ and $C2_t$ with different odd/even properties for the input word $D_t$ of such specific patterns of three consecutive input words (which patterns are hereinafter, referred to as "DSV controllable input patterns"), selecting such an output code as makes the DSV smaller enables the control of the DSV without the need of margining bit while satisfying the (1, 7) RLL constraints. The 4-to-6 code tables 120 contains four types of DSV-controllable input patterns as detailed in the following.

If the next table code $NT_{t-2}$ for an input word $D_t$ of two words before is "0" or "3", a previous input word $D_{t-1}$ is "15" and a current input word $D_t$ is any of "0" through "3", then the previous output code $C_{t-1}$ is 010000 (=16 in decimal) and corresponding $NT_{t-1}$ is 3 in either case of $NT_{t-2}$ =0 or 3; and though the current output code $C_t$ for the current input word $D_t$ (=0, 1, 2 or 3) should be found in table 3 specified by $NT_{t-1}$, the output code retriever 110 outputs both of the output codes $C1_t$ and $C2_t$ associated with the current input word $D_t$ not only in table 3 specified by $NT_{t-1}$ but also in a predetermined table 1 so that a suitable one of them $C1_t$ and $C2_t$ can be used for the DSV control in the following stage. In this example, an original output code $C1_t$ is 010101, 010101, 100101 or 100101 obtained from table 3, and an alternative output code $C2_t$ is 001001, 001001, 000101 or 000101 obtained from table 1. As seen from these codes, the original output codes $C1_t$ are odd in the number of symbols "1" while the alternative output codes $C2_t$ are even in the number of symbols "1". Thus, original or alternative output codes can be selected for the last input word (0, 1, 2 or 3) of this type of DSV-controllable input patterns so as to minimize the DSV value.

FIG. 5 is a diagram showing four types of DSV-controllable input word patterns available with the 4-to-6 code system or tables of FIG. 4. In FIG. 5, the just-described DSV-controllable input pattern is listed in the first record "1". If we denote an i-th DSV-controllable input pattern by Pi=($NT_{t-2}$, $D_{t-1}$, $D_t$) (i=2, 3, and 4), then the first DSV-controllable input pattern is expressed as:

P1=(0 or 3, 15, 0–3)

Similarly, the second through fourth DSV-controllable input patterns are be expressed as:

P2=(or 3, 14, 7–15)

P3=(3, 13, 0 or 1), and

P4=(3, 12, 10–15).

It is noted that the alternative tables AT1 through AT4 for the last input words in the four DSV-controllable input patterns are advantageously identical, i.e., table 1 (i.e., AT1=AT2=AT3=AT4=1). It is the alternative code existence checker 100 that detects a DSV-controllable input pattern. For this purpose, the checker 100 stores the four DSV-controllable input pattern data P1 through P4 and corresponding alternative table numbers AT1 through AT4 if the alternative table number varies depending on the type of an occurred DSV-controllable input pattern. Since an identical table 1 is used for the four patterns P1 through P4, the alternative code existence checker 100 has only to store the four DSV-controllable input pattern data P1 through P4 in this specific embodiment.

Returning to FIG. 2, the modulation operation of the 4-to-6 modulator 12 is described in the following. In FIG. 2, an input data word for the current modulation cycle t is denoted by "Dt"; the output code for the current input code $D_t$ is denoted by "$C1_t$"; and an alternative (or optional) output code for $D_t$, if any, is denoted by "$C2_t$".

If the alternative code existence checker 100 receives an input data word Dk, then the alternative code existence checker 100 makes a test to see if the next table code $NT_{t-2}$ of two words before and the previous input word $D_{t-1}$ stored in not shown buffer memory coincides with any of the DSV-controllable input patterns P1 through P4 stored in the not-shown read only memory. If so, the alternative code existence checker 100 sends a DSV control signal indicative of the existence of an alternative code table or output code $C2_t$ to the output code retriever 110 and the absolute value comparator 140, and stores the received input word $D_t$ as the previous input word $D_{t-1}$.

If the output code retriever 110 receives the input word $D_t$ without receiving the DSV control signal, then the output code retriever 110 responsively obtains an output code $C_t$ and next table code $NT_t$ associated with the input word $D_t$ in a table specified by the next table code $NT_{t-1}$ stored in the not-shown memory to launch the output code $C_t$ into the two output terminals "1" and "2" and to supply the next table code $NT_t$ to the alternative code existence checker 100 while storing the next table code as $NT_{t-1}$ in the not-shown memory.

If the output code retriever 110 receives both the input word $D_t$ and the DSV control signal, then the output code retriever 110 obtains, for the input code $D_t$, not only an output code $C1_t$ and next table code $NT1_t$ in a table specified by the next table code $NT_{t-1}$ stored in the not-shown memory but also an output code $C2_t$ and next table code $NT2_t$ in a table specified by the predetermined alternative table number AT stored in a read only memory (not shown). The output code retriever 110 launches the output codes $C1_t$ and $C2_t$ into the output terminals "1" and "2" respectively. In this case, in response to the DSV control signal from the alternative code existence checker 100, the absolute value comparator 140 outputs a second DSV control signal indicative of the data path DP1 or DP2 that retains a smaller one of the DSV values $DSV1_{t-1}$ and $DSV2_{t-1}$. In response to this second DSV control signal, the output code retriever 110 supplies the alternative code existence checker 100 with one of the next table codes $NT1_t$ and $NT2_t$ which corresponds to the second DSV control signal and stores the supplied next table code as $NT_{t-1}$ in the not-shown memory. Receiving the next table code from the output code retriever 110, the alternative code existence checker 100 stores the received next table code as $NT_{t-1}$.

Usually (except for a short period from the DSV value updating till the end of the modulation cycle), the values DSV1 and DSV2 of the DSV memories 130 and 132 are equal to the DSV values calculated for the output codes till the last modulation cycle, i.e., $DSV1_{t-1}$ and $DSV2_{t-1}$ respectively.

The queue memories 131 and 133 stores output queues Q1 and Q2, respectively. The queue Q1 contains the output codes from the modulation cycle (Tdsvc) when the DSV control was last executed to the last modulation cycle t−1. That is, $$Q1 = C1_{t-1}, C1_{t-2}, \ldots, C1_{Tdsvc}.$$

The queue Q1 contains an alternative output code when the DSV control was last executed and the output codes for the modulation cycles from Tdsvc to t−1. That is, $$Q2 = C1_{t-1}, C1_{t-2}, \ldots, C2_{Tdsvc}.$$

If an alternative output code exists (i.e., the alternative code existence checker 100 has detected a DSV-controllable input pattern) or a DSV control is to be carried out in a modulation cycle t, the memory/output controller 150 outputs the contents of the queue memory (Q1 or Q2) of the data path (DP1 or DP2) in which the absolute value of the DSV memory contents is smaller.

Though we have shown, in FIG. 2, an example of hardware implementation of the 4-to-6 modulator 12 of FIG. 1, the 4-to-6 modulator 12 may be embodied by software.

Figure 6:
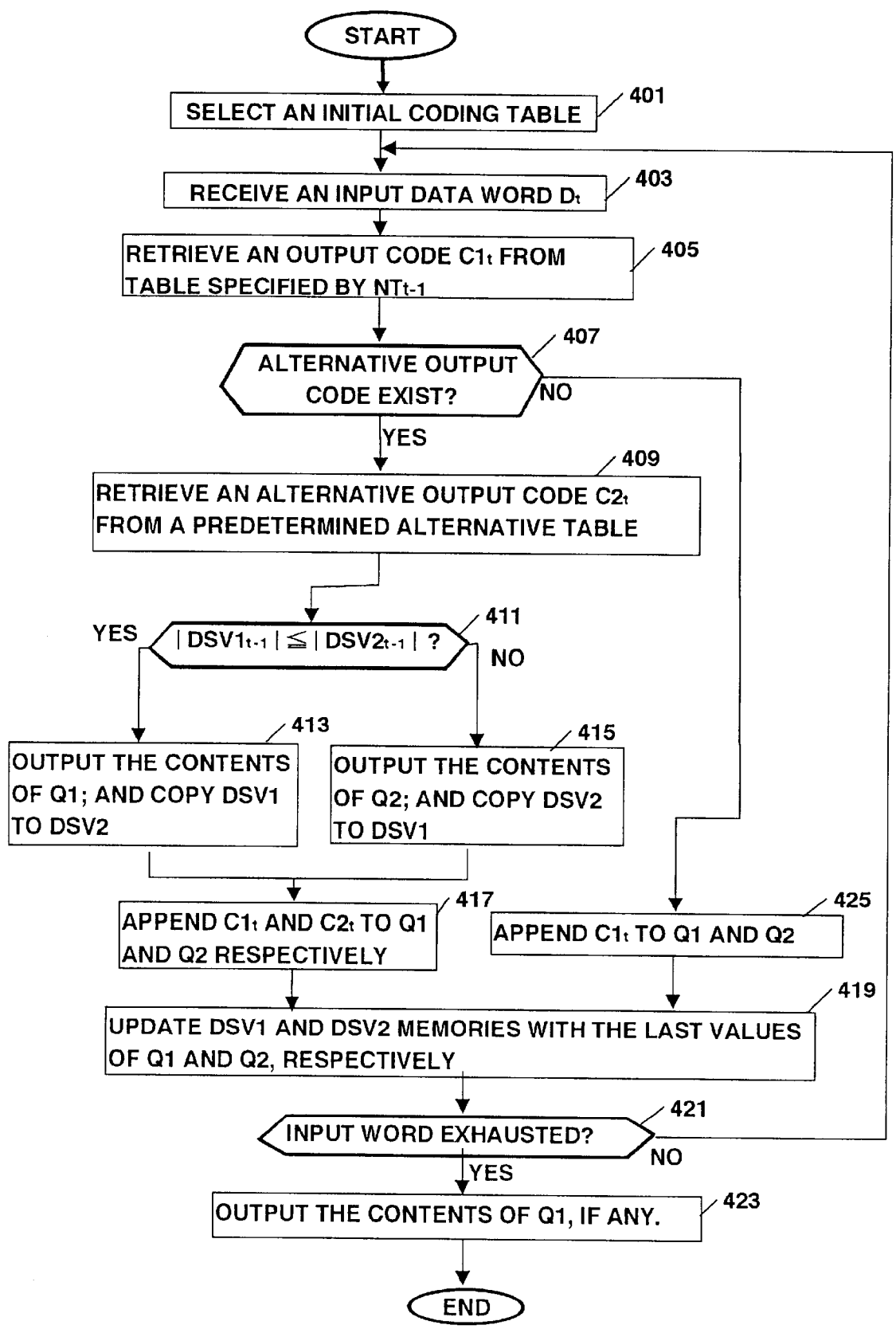
FIG. 6 is a flowchart showing a modulation operation performed by a not-shown CPU in the modulator 12 in accordance with the principles of the invention.

FIG. 6 is a flowchart showing a modulation operation performed by a not-shown CPU in the modulator 12 in accordance with the principles of the invention. Referring to FIGS. 2 and 6, the operation of the modulator 12 is described in the following.

As one of initial setting procedures, an initial table (table 0 in a preferred embodiment) is first selected before accepting an input word sequence in step 401. Then, an input word $D_t$ is input in step 403. An output code $C1_t$ corresponding to the input word $D_t$ is retrieved from the table specified by the next table code $NT_{t-1}$ in step 405. The table for the current state is determined by the previous output code, and is assumed to be table 0 for the first code of an input word sequence.

In step 407, a test is made to see if any of the four DSV-controllable input patterns is detected.

If the test result is NO in step 407, then the retrieved output code $C1_t$ is appended to the ends of the queues Q1 and Q2 of the queue memory 131 in step 425. The values of the DSV memories DSV1 and DSV2 are updated with the last values of the queues Q1 and Q2 in step 419. Then, a test is made to see if the input word sequence has been exhausted in step 421. If so, then the content of Q1, if any, is output in step 423, and the operation is terminated. Otherwise, the control is returned to step 403.

If the test result is YES in step 407, then the control is passed to step 409, where an alternative output code $C2_t$ is retrieved from a predetermined alternative table. Further, in step 411, a test is made to see if the absolute value of $DSV1_{t-1}$ (the digital sum value stored in the DSV1 memory 130) is not larger than that of $DSV2_{t-1}$ (the digital sum value stored in the DSV2 memory 132). If so, the control is passed to step 413, where the output code sequence in the queue Q1, i.e., $C1_{t-1}, C1_{t-2}, \ldots, C1_{Tdsvc}$ is output as a part of the output code sequence from the 4-to-6 modulator 12; and the DSV1 memory 130 contents or $DSV1_{t-1}$ is copied to the DSV2 memory 132 (These operations are executed by the memory/output controller 150 in case of hardware implementation).

If the absolute value of $DSV1_{t-1}$ is larger than that of $DSV2_{t-1}$ in step 411, then the control is passed to step 415, where the output code sequence in the queue Q2, i.e., $C1_{t-1}, C1_{t-2}, \ldots, C2_{Tdsvc}$ is output as a part of the output code sequence; and the DSV2 memory 132 contents or $DSV2_{t-1}$ is copied to the DSV1 memory 130 (These operations are executed by the memory/output controller 150 in case of hardware implementation).

Following step 413 or 415, the control is passed to step 417, where the retrieved codes $C1_t$ and $C2_t$ are appended to the output code queues Q1 and Q2, respectively. Then, the control is passed to the above-described step 419 and accordingly the description of the subsequent operation is omitted here.

In this way, the 4-to-6 modulator modulates an input 4-bit code sequence into a 6-bit code sequence suited for NRZI recording on the optical disc.

Figure 7:
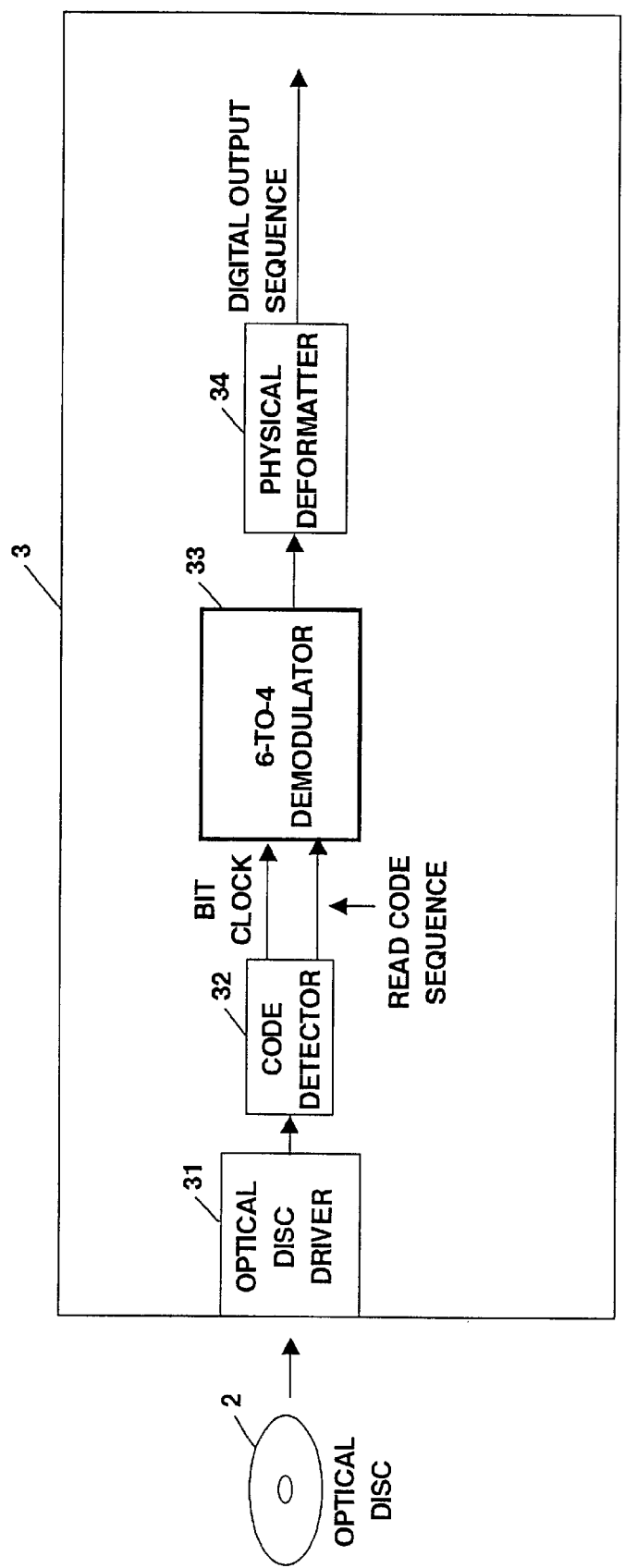
FIG. 7 is a schematic block diagram showing an exemplary device 3 that includes an optical disc playing system (31 through 34) provided with an 6-to-4 demodulator 33 according to the principles of the invention.

FIG. 7 is a schematic block diagram showing an exemplary device 3 that includes an optical disc playing system (31 through 34) provided with an 6-to-4 demodulator 33 according to the principles of the invention. The device 3 of FIG. 7 may be any device that includes the inventive 6-to-4 demodulator 33 to reproduce multimedia information that is recorded on an optical disc 2 by using the device 1 of FIG. 1. The device 3 includes an optical disc driver 31, a code detector 32, the 6-to-4 demodulator 33 and a physical deformatter 34.

In optical disc playing operation, the optical disc driver 31 reads a recorded signal on the optical disc 2. The code detector 32 detects a code sequence and a bit clock from the read signal. Using the bit clock, the 6-to-4 demodulator 33 recovers 6-bit codes from the code sequence and demodulates the 6-bit codes into a 4-bit code sequence by using the code table 120 of FIG. 4. The physical deformatter 34 removes ECC and sync signals from the 8-bit code sequence to provide a digital output sequence.

Figure 8:
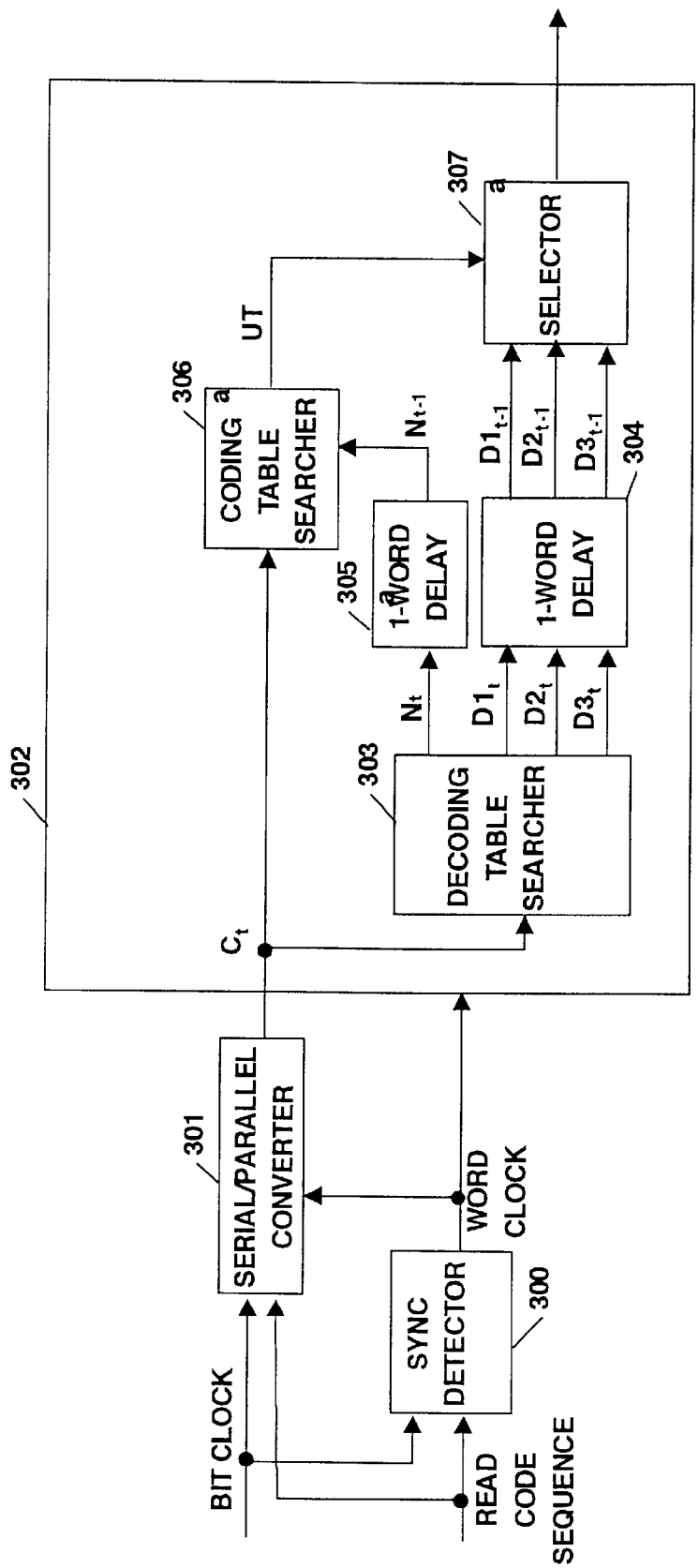
FIG. 8 is a schematic block diagram showing an arrangement of the 6-to-4 demodulator 33 of FIG. 7.

FIG. 8 is a schematic block diagram showing an arrangement of the 6-to-4 demodulator 33 of FIG. 7. The demodulator 33 comprises a sync detector 300 that receives a read code sequence and a bit clock and supplies a word clock, a serial/parallel converter 301 that receives the read code sequence and the bit clock and the word clock to output a 6-bit code sequence $C_t$, and a demodulator portion 302. The demodulator portion 302 comprises a decoding table searcher 303, a triple 1-word delay 304, a 1-word delay 305, a coding table searcher 306, and a selector 307. The coding table searcher 306 includes the above-described code table 120.

The read code sequence from the code detector 32 is supplied to the sync detector 300 and the serial/parallel converter 301.The bit clock from the code detector 32 is supplied to the sync detector 300 and the serial/parallel converter 301.The sync detector 300 generates a word clock, which is used for recovering 6-bit codes from the read code sequence. The word clock is supplied to the serial/parallel converter 301 and the demodulator portion 302.

Using the word clock, the serial/parallel converter 301 converts each code of the read code sequence into a 6-bit code $C_t$, which is supplied to the decoding table searcher 303 and the coding table searcher 306.The decoding table searcher 303 includes a decoding table as shown in FIG. 9

In FIG. 9, the second column is an input code (C) field that lists the possible 6-bit binary codes that satisfies the (1, 7) RLL constraints. The first column is a decimal number field that lists the decimal numbers corresponding to the 6-bit binary codes in the second column.

The third column is a possible table (N) field that contains a possible table indicator (N) indicative of 4-to-6 code tables that might be used for the coding of the next input code $C_{t+1}$. The indicator N can have three values 0 through 2 as shown in the following table.

TABLE 1

| indicator N | possible code tables used for $C_{t+1}$ |
|---|---|
| 0 | 0 or 1 |
| 1 | 1, 2, or 3 |
| 2 | 2 or 3 |

If N is zero, then it indicates that the next code $C_{t+1}$ might have been coded with table 0 or 1. If the indicator N is one, then the next code $C_{t+1}$ might have been coded with table 1, 2 or 3. If the indicator N is two, then the next code $C_{t+1}$ might have been coded with table 2 or 3.

The fourth through seventh columns are four decoded data (D) fields labeled "0" through "3" which each indicate the used code table for coding of the next input code $C_{t+1}$. For example, if the next code $C_{t+1}$ has been modulated by using code table T (T=0, 1, 2, or 3), then the seeking 4-bit output word for the input code $C_t$ is found at the intersection of the record "$C_t$" and the column of UT=T. In this example, the variable UT serves as an decoded data field ID.

Returning to FIG. 8, if the decoding table searcher 303 receives the input code $C_t$, then the searcher 303 obtains a possible table indicator $N_t$ and all of decoded data words associated with the input code $C_t$ and outputs all of the indicator $N_t$ and the decoded data words $D1_t$, $D2_t$ and $D3_t$. The indicator $N_t$ is delayed by the 1-word delay 305 into $N_{t-1}$, which is in turn supplied to the decoding table searcher 306.The decoded data words $D1_t$, $D2_t$ and $D3_t$ are all delayed by the triple 1-word delay 304 into $D1_{t-1}$, $D2_{t-1}$ and $D3_{t-1}$, which are supplied to the selector 307.

The coding table searcher 306 determines the 4-to-6 code table used for the next input code $C_{t+1}$ by using the indicator $N_t$ which is supplied at the cycle time t+1. Specifically, the searcher 306 first searches the tables 0 through 3 for the code $C_{t+1}$. If the code $C_{t+1}$ is found only in one table "T", then the searcher 306 determines that the code $C_{t+1}$ was modulated with the table T to output the table number T as a decoded data field ID of the decoding table of FIG. 9. However, if the next input code $C_{t+1}$ is found in more than one code tables (for example, $C_{t+1}$=18 is found in tables 0 and 2), the coding table searcher 306 further uses the indicator $N_t$ to decide the code table used for the code $C_{t+1}$ referring to the above-described table 1.

By using the decoded data field ID UT, the selector 307 selects one of the received data words $D1_{t-1}$, $D2_{t-1}$ and $D3_{t-1}$.

For example, we assume that an input code sequence 18, 2, 18, 41, 1 is input. Then, as for $C_t$=18, N=1, which means the code $C_{t+1}$ has been coded with table 1, 2 or 3,and $D_t$=4, 5, or 6. As for $C_{t+1}$=2, then since "2" is only found in table 1, UT=1. Accordingly, a decoded date word $D_t$ for $C_t$ is in column "1" in the record "18", i.e., $D_t$=4. As for $C_{t+2}$=18, $C_{t+2}$ is found in tables 0 and 2 and $N_{t+1}$=1 meaning UT=1, 2, or 3. Accordingly, UT=2 for $C_{t+1}$, then $D_{t+1}$=5, and so on. In the same way, $D_{t+2}$=6 and $D_{t+3}$=7 can be obtained.

The algorithm of the demodulator 302 is shown in the C language in the following. If the possible table indicator N is 2, then the code word may have been exchanged for the DSV control. Such a situation is also included in the following algorithm.

```
if (the indicator N==0)
    {if (C_{t+1} has been coded with table "0")
        {data D1_t in column "0" is selected for the decoded data;}
        else {data D2_t in column "1" is selected for the decoded data;}}
if (the indicator N==1)
    {if (C_{t+1} has been coded with table "1")
        {data D1_t in column "1" is selected for the decoded data;}
        else if (C_{t+1} has been coded with table "2")
        {data D2_t in column "2" is selected for the decoded data;}
        else {data D3_t in column "3" is selected for the decoded data;}}
if (the indicator N==2)
    {if (C_{t+1} has been coded with a code D_t >= 7 in table "2" or "1")
        {data D1_t in column "2" is selected for the decoded data;}
        else {data D2_t in column "3" is selected for the decoded data;}}
```

Many widely different embodiments of the present invention may be constructed without departing from the spirit and scope of the present invention. It should be understood that the present invention is not limited to the specific embodiments described in the specification, except as defined in the appended claims.

What is claimed is:

1. A code table system for use in converting each input code of a 4-bit input code sequence into a 6-bit output code whose NRZI-converted version satisfies (1, 7) run-length-limited (RLL) constraints in a 4-to-6 modulator which simply concatenates the converted 6-bit output codes into a 6-bit output code sequence that still satisfies the run-length limited constraints, the code table system comprising;

a column for storing $2^4$ possible 4-bit input codes in order of magnitude; and a plurality of columns (hereinafter referred to as "tables"), each table comprising a table ID for identifying said table and $2^4$ combinations of 6-bit output codes and respective next table fields which combinations are associated in the row directions with respective input codes, each of said next table fields containing a table ID of an table to be used in a modulation of a next source of said input code sequence so as to cause said input code sequence to satisfy said RLL constraints, and output codes being permitted to appear repeatedly in said 6-bit output codes in each table such that combinations of appearances of each of said repeated output codes and respective next table fields are unique in said table, and wherein if one of predetermined patterns of three consecutive input codes is to be coded and if a third input code of said one predetermined pattern is in a predetermined input code range, then an output code associated with said third input code in an original table specified by a next table field associated with a second input code of said one predetermined pattern can be replaced with a corresponding output code in an alternative table assigned to said one predetermined pattern, an odd/even property of output codes of said original table which correspond to said predetermined input code range is different from that of output codes of said alternative table which correspond to said predetermined input code range.

2. A method of modulating a 4-bit input code sequence into a 6-bit output code sequence which includes no merging bit and whose NRZI converted version satisfies (1, 7) run-length-limited constraints in a 4-to-6 modulator provided with a code system comprising a column for storing $2^4$ possible 4-bit input codes in order of magnitude and a plurality of columns (hereinafter referred to as "tables"), each table comprising a table ID for identifying the table and $2^4$ combinations of 6-bit output codes and respective next table fields which combinations are associated in the row directions with respective input codes, each of said next table fields containing a table ID of an table to be used in a modulation of a next source of said input code sequence so as to cause said input code sequence to satisfy said RLL constraints, and output codes being permitted to appear repeatedly in said 6-bit output codes in each table such that combinations of appearances of each of said repeated output codes and respective next table fields are unique in said table, and wherein if one of predetermined patterns of three consecutive input codes is to be coded and if a third input code of said one predetermined pattern is in a predetermined input code range, then an output code associated with said third input code in an original table specified by a next table field associated with a second input code of said one predetermined pattern can be replaced with a corresponding output code in an alternative table assigned to said one predetermined pattern, an odd/even property of output codes of said original table which correspond to said predetermined input code range is different from that of output codes of said alternative table which correspond to said predetermined input code range, the method comprising the steps of:

retrieving a first output code associated with an input code of said input code sequence from a table identified by a next table field attached to the last modulated output code;

making a test to see if said input code and the two input codes following said input code in said input code sequence coincide with any of said predetermined pattern;

in response to a pass in said test, retrieving a second output code associated with said input code of said input code sequence from said alternative table;

calculating a first digital sum value (DSV) and a second DSV by using said first output code and said second output code, respectively;

if the absolute value of said second DSV is smaller than that of said first DSV, including said second output code in said 6-bit output code sequence; and if said test is unsuccessful or if the absolute of said second DSV is not smaller than that of said first DSV, including said first output code in said 6-bit output code sequence.

3. A method as defined claim 2, further comprising the steps of:

storing said first DSV and said second DSV in a first and second locations, respectively;

prior to said step of calculating said first DSV and said second DSV, comparing a first absolute value of a first DSV stored in said first location and a second absolute value of a second DSV stored in said second location, in response to said pass in said test, appending said first and second output codes to a first output code queue and a second output code queue, respectively; and in response to a failure in said test, appending said first output code to said first output code queue and said second output code queue, wherein said step of including said second output code comprises the step of, if said second absolute value is smaller than said first absolute value, outputting the contents of said second output code queue, and wherein said step of including said first output code comprises the step of, if said test is successful or if said second absolute value is not smaller than said first absolute value, outputting the contents of said first output code queue.

4. A method of demodulating a 6-bit code sequence into a 4-bit code sequence in a 6-to-4 demodulator provided with:

a decoding table for associating each of possible 6-bit current codes with an indicator and corresponding 4-bit codes further associated with respective table ID's for use in a demodulation of a next 6-bit code following a current 6-bit code, said indicator indicating a table list listing ID's of tables that might be used for coding of said next 6-bit code; and means for associating a 6-bit code with at least one coding table ID from which said 6-bit code can be derived, the method comprising the steps of:

finding said indicator and said corresponding 4-bit codes from said decoding table by using said current 6-bit code;

obtaining said at least one coding table ID for said next 6-bit code from said means by using said next 6-bit code;

a table ID used and said indicator;

finding, as a next table ID for said next 6-bit code, a table ID common to said at least one coding table ID and table ID's listed in said table list indicated by said indicator; and obtaining a 4-bit code associated with said current 6-bit code and said common table ID and outputting said obtained 4-bit code.

5. A system for modulating a 4-bit input code sequence into a 6-bit output code sequence which includes no merging bit and whose NRZI converted version satisfies (1, 7) run-length-limited constraints, the system comprising:

a code table comprising a column for storing $2^4$ possible 4-bit input codes in order of magnitude and a plurality of columns (hereinafter referred to as "tables"), each table comprising a table ID for identifying the table and $2^4$ combinations of 6-bit output codes and respective next table fields which combinations are associated in the row directions with respective input codes, each of said next table fields containing a table ID of an table to be used in a modulation of a next source of said input code sequence so as to cause said input code sequence to satisfy said RLL constraints, and output codes being permitted to appear repeatedly in said 6-bit output codes in each table such that combinations of appearances of each of said repeated output codes and respective next table fields are unique in said table, and wherein if one of predetermined patterns of three consecutive input codes is to be coded and if a third input code of said one predetermined pattern is in a predetermined input code range, then an output code associated with said third input code in an original table specified by a next table field associated with a second input code of said one predetermined pattern can be replaced with a corresponding output code in an alternative table assigned to said one predetermined pattern, an odd/even property of output codes of said original table which correspond to said predetermined input code range is different from that of output codes of said alternative table which correspond to said predetermined input code range;

means for retrieving a first output code associated with an input code of said input code sequence from a table identified by a next table field attached to the last modulated output code;

means for making a test to see if said input code and the two input codes following said input code in said input code sequence coincide with any of said predetermined pattern;

means, responsive to a pass in said test, for retrieving a second output code associated with said input code of said input code sequence from said first table;

means for calculating a first digital sum value (DSV) and a second DSV by using said first output code and said second output code, respectively;

means, responsive to a determination that the absolute value of said second DSV is smaller than that of said first DSV, for including said second output code in said 6-bit output code sequence; and means, responsive to either a determination that said test is unsuccessful or a determination that the absolute of said second DSV is not smaller than that of said first DSV, for including said first output code in said 6-bit output code sequence.

6. A system as defined claim 5, further comprising:

means for storing said first DSV and said second DSV in a first and second locations, respectively;

means, operative prior to said means for calculating said first DSV and said second DSV, for comparing a first absolute value of a first DSV stored in said first location and a second absolute value of a second DSV stored in said second location, means, responsive to said pass in said test, for appending said first and second output codes to a first output code queue and a second output code queue, respectively; and means, responsive to a failure in said test, for appending said first output code to said first output code queue and said second output code queue, wherein said means for including said second output code comprises means, in the event said second absolute value is smaller than said first absolute value, for outputting the contents of said second output code queue, and wherein said means for including said first output code comprises means, in the event said test is successful or in the event said second absolute value is not smaller than said first absolute value, for outputting the contents of said first output code queue.

7. A system for demodulating a 6-bit code sequence into a 4-bit code sequence, the system comprising:

a decoding table for associating each of possible 6-bit current codes with an indicator and corresponding 4-bit codes further associated with respective table ID's for use in a demodulation of a next 6-bit code following a current 6-bit code, said indicator indicating a table list listing ID's of tables that might be used for coding of said next 6-bit code;

means for associating a 6-bit code with at least one coding table ID from which said 6-bit code can be derived;

means for finding said indicator and said corresponding 4-bit codes from said decoding table by using said current 6-bit code;

means for obtaining said at least one coding table ID for said next 6-bit code from said means by using said next 6-bit code;

means for finding, as a next table ID for said next 6-bit code, a table ID common to said at least one coding table ID and table ID's listed in said table list indicated by said indicator; and means for obtaining a 4-bit code associated with said current 6-bit code and said common table ID and outputting said obtained 4-bit code.

8. An optical disc storing an NRZI converted version of a 6-bit output code sequence obtained through a method of modulating a 4-bit input code sequence into the 6-bit output code sequence which includes no merging bit and whose NRZI converted version satisfies (1, 7) run-length-limited constraints in a 4-to-6 modulator provided with a code table comprising a column for storing $2^4$ possible 4-bit input codes in order of magnitude and a plurality of columns (hereinafter referred to as "tables"), each table comprising a table ID for identifying the table and $2^4$ combinations of 6-bit output codes and respective next table fields which combinations are associated in the row directions with respective input codes, each of said next table fields containing a table ID of an table to be used in a modulation of a next source of said input code sequence so as to cause said input code sequence to satisfy said RLL constraints, and output codes being permitted to appear repeatedly in said 6-bit output codes in each table such that combinations of appearances of each of said repeated output codes and respective next table fields are unique in said table, and wherein if one of predetermined patterns of three consecutive input codes is to be coded and if a third input code of said one predetermined pattern is in a predetermined input code range, then an output code associated with said third input code in an original table specified by a next table field associated with a second input code of said one predetermined pattern can be replaced with a corresponding output code in an alternative table assigned to said one predetermined pattern, an odd/even property of output codes of said original table which correspond to said predetermined input code range is different from that of output codes of said alternative table which correspond to said predetermined input code range, the method comprising the steps of:

retrieving a first output code associated with an input code of said input code sequence from a table identified by a next table field attached to the last modulated output code;

making a test to see if said input code and the two input codes following said input code in said input code sequence coincide with any of said predetermined pattern;

in response to a pass in said test, retrieving a second output code associated with said input code of said input code sequence from said alternative table;

calculating a first digital sum value (DSV) and a second DSV by using said first output code and said second output code, respectively;

if the absolute value of said second DSV is smaller than that of said first DSV, including said second output code in said 6-bit output code sequence; and if said test is unsuccessful or if the absolute of said second DSV is not smaller than that of said first DSV, including said first output code in said 6-bit output code sequence.

* * * * *